United States Patent
Boulard et al.

(10) Patent No.: US 10,923,524 B2
(45) Date of Patent: Feb. 16, 2021

(54) SUPPORT FOR FORMING AN OPTOELECTRONIC COMPONENT, OPTOELECTRONIC COMPONENT AND METHOD FOR MANUFACTURING SUCH A SUPPORT AND SUCH A COMPONENT

(71) Applicant: COMMISSARIAT A L'ENERGIE ATOMIQUE ET AUX ENERGIES ALTERNATIVES, Paris (FR)

(72) Inventors: Francois Boulard, Grenoble (FR); Christophe Grangier, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/372,588

(22) Filed: Apr. 2, 2019

(65) Prior Publication Data

US 2019/0305017 A1  Oct. 3, 2019

(30) Foreign Application Priority Data

Apr. 3, 2018  (FR) ..................... 18 00273

(51) Int. Cl.
*H01L 27/146* (2006.01)
*H01L 23/544* (2006.01)
(Continued)

(52) U.S. Cl.
CPC ........ *H01L 27/1465* (2013.01); *H01L 23/544* (2013.01); *H01L 27/1446* (2013.01);
(Continued)

(58) Field of Classification Search
CPC ............... H01L 23/544; H01L 27/1465; H01L 27/1446; H01L 27/14618; H01L 27/14634;
(Continued)

(56) References Cited

U.S. PATENT DOCUMENTS 5,075,201 A  12/1991 Koh
5,177,580 A  1/1993 Norton et al.
(Continued)

FOREIGN PATENT DOCUMENTS

FR  3 025 359 A1  3/2016
WO  WO 2013/079447 A1  6/2013

OTHER PUBLICATIONS

French Preliminary Search Report dated Dec. 20, 2018 in French Application 18 00273, filed on Apr. 3, 2018 (with English Translation of Categories of Cited Documents).
(Continued)

*Primary Examiner* — Shahed Ahmed
(74) *Attorney, Agent, or Firm* — Oblon, McClelland, Maier & Neustadt, L.L.P.

(57) ABSTRACT

The invention relates to a method for manufacturing a first support (100) for forming, in particular with a functionalised second support (200), an optoelectronic component (1), the first support (100) comprising a semiconductor layer (110) and an alignment mark (140) provided on said semiconductor layer (110). The manufacturing method includes in particular a step of forming an aperture (141) in a semiconductor layer (110) comprising cadmium, a step of diffusing cadmium in a second location (142) of the aperture (141) and a cadmium sensitive etching step for promoting etching of one from the second location (142) which is rich in cadmium and the rest of a surface (110B) of the semiconductor layer (110). The invention also relates to a first support (100).

17 Claims, 5 Drawing Sheets

(51) Int. Cl.
*H01L 31/032* (2006.01)
*H01L 31/18* (2006.01)
*H01L 31/0296* (2006.01)
*H01L 27/144* (2006.01)

(52) U.S. Cl.
CPC .... *H01L 27/1469* (2013.01); *H01L 27/14618* (2013.01); *H01L 27/14634* (2013.01); *H01L 27/14636* (2013.01); *H01L 27/14696* (2013.01); *H01L 31/0296* (2013.01); *H01L 31/032* (2013.01); *H01L 31/1864* (2013.01); *H01L 2223/54426* (2013.01)

(58) Field of Classification Search
CPC ........... H01L 27/14636; H01L 27/1469; H01L 27/14696; H01L 31/0296; H01L 31/032; H01L 31/1864; H01L 2223/54426
See application file for complete search history.

(56) References Cited

U.S. PATENT DOCUMENTS

| | | | |
|---|---|---|---|
| 9,450,013 | B2 | 9/2016 | Mollard et al. |
| 9,673,350 | B2 | 6/2017 | Boulard et al. |
| 9,911,743 | B2* | 3/2018 | Bertin .................. B82Y 10/00 |
| 10,128,386 | B2 | 11/2018 | Boulard et al. |
| 10,141,470 | B2 | 11/2018 | Boulard et al. |
| 2005/0025352 | A1* | 2/2005 | Suzuki ...................... G06T 7/70 382/151 |
| 2010/0283069 | A1* | 11/2010 | Rogers ................... H01L 33/06 257/98 |
| 2011/0062457 | A1* | 3/2011 | Naito .................... H01L 27/156 257/88 |
| 2015/0243825 | A1 | 8/2015 | Keasler et al. |
| 2016/0064335 | A1 | 3/2016 | Chevrier et al. |
| 2017/0025453 | A1* | 1/2017 | Bornfreund ....... H01L 27/14634 |
| 2017/0330876 | A1* | 11/2017 | Leedy ................ H01L 27/1446 |

OTHER PUBLICATIONS

Mollard, L., et al. "Planar p-on-n HgCdTe FPAs by Arsenic Ion Implantation", Journal of Electronic Materials, 38(8), 2009, pp. 1805-1813.

Boulard, F., et al. "Influence of Cadmium Composition on $CH_4$—$H_2$-Based Inductively Coupled Plasma Etching of $Hg_{1-x}Cd_xTe$", Journal of Electronic Materials, 39(8), 2010, pp. 1256-1261.

Benson, J., et al. "Characteristics of Dislocations in (112)B HgCdTe/CdTe/Si", Journal of Electronic Materials, 39(7), 2010, pp. 1080-1086.

* cited by examiner

SUPPORT FOR FORMING AN OPTOELECTRONIC COMPONENT, OPTOELECTRONIC COMPONENT AND METHOD FOR MANUFACTURING SUCH A SUPPORT AND SUCH A COMPONENT

TECHNICAL FIELD

The invention relates to the field of microelectronics and optoelectronics and is more particularly directed to the detection of infrared radiations.

More particularly, the object of the invention is a first support for forming an optoelectronic component, said optoelectronic component and the methods for manufacturing said first support and said component.

STATE OF PRIOR ART

The manufacture of optoelectronic components, such as a matrix detector, often requires the assembly of several supports to each other.

Indeed, if the matrix sensor above is taken as an example, such a component includes:
- a first support comprising the sensing structures as such, for example diode (more precisely photodiode) type structures
- a second support comprising optical elements, such as lenses and/or wavelength filters,
- a third support comprising a control and processing circuit adapted to feed the structures and process the signals generated by the same upon receiving a radiation by the same.

In a usual configuration of such a component:
- the first support has a first and a second face and comprises a plurality of structures, flushing with the first face and each having at least one metal contact,
- the second support comprises the plurality of optical elements, each in correspondence with a respective structure of the first support, the second support being assembled to the first support by the second face of said first support with each of the optical elements aligned with the corresponding structure,
- the third support comprises a plurality of processing structures and a plurality of metal contacts each corresponding to a metal contact of the first support, the third support being assembled to the first support by the first face of said first support with each of the metal contacts of the third support aligned and contacted by hybridisation through indium balls with a corresponding metal contact of the third support.

Thus, the manufacture of such a component necessarily involves steps of aligning the second and third supports relative to the first support and its structures. If the alignment of the third support relative to the first support is made relatively easy because of the presence of the metal contacts on the first face of the first support, the step of aligning the second support relative to the first support is particularly problematic. That, indeed, has to be done relative to the structures located opposite to the second face of the first support to which the second support has to be assembled.

In order to facilitate such an alignment of the second support relative to the first support, it is known from documents U.S. Pat. No. 5,075,201 and FR 3025359 to provide marking zones on the first support.

In the case of document U.S. Pat. No. 5,075,201, these support zones pass through the entire first support and are thus available on each of the first and the second face of the support. In the case of document FR 3025359, these marking zones are obtained by providing valleys on a growth substrate and by growing a semiconducting layer, for forming the first support, on said substrate. After removing the substrate by selective etching, bonding the valleys of the growth substrate enables marking zones to be created on each of the first and the second face, one being positive, that is in the form of projections, and other negatives, that is in the form of valleys.

However, if these marking zones, regardless of whether they comply with document U.S. Pat. No. 5,075,201 or document FR 3025359, allow alignment of the second support with respect to the first support, they are in no way correlated with the actual positioning of the structures of the first support. The teaching of both those documents thus does not make it possible to take a possible misalignment between the marking zones and the diode type structures of the first support into account and can thus be detrimental to the manufacture of the component and thus generate a dysfunction in the component obtained.

DISCLOSURE OF THE INVENTION

The invention aims at overcoming this drawback and thus has the purpose to provide a first support which has marking zones perfectly correlated with the positioning of the diode type structures of said first support.

Thus, one object of the invention is a method for manufacturing a first support for forming, in particular with a functionalised second support, an optoelectronic component, the first support having a first and a second face and comprising a plurality of diode type structures at least one metal contact of which flushes with the first surface, and an alignment mark on the second face able to allow alignment with the second support upon assembling the first support through its second face to the second support for forming the optoelectronic component and thus to obtain that the structures are aligned with functionalisation of the second support, the method comprising the following steps of:
- providing a substrate, the substrate comprising a support layer made of a first material comprising cadmium, and a semiconductor layer having a first and a second surface and being in contact with the support layer through the second surface of said semiconductor layer, the semiconductor layer being made of a second material comprising a cadmium atomic proportion $x_2$ lower than a cadmium atomic proportion $x_1$ of the first material,
- forming an aperture in the semiconductor layer from the first surface towards the second surface,
- implanting in a localised manner arsenic of the semiconductor layer through the first surface on a plurality of first locations of the semiconductor layer and at a second location located in the aperture for forming respectively the structures and an alignment mark, the localised implantation reaching the second surface (110B) in the second location,
- heat treating able to activate the implanted arsenic on the plurality of first locations to form doped zones of a second conductivity type in which the majority carriers are holes, said doped zones participating in forming the structures, the heat treatment being also adapted to allow cadmium diffusion from the support layer to the second location, said diffusion being promoted by the arsenic implanted in said second location and allowing providing the alignment mark flushing with the second surface and which has a cadmium atomic proportion $x_3$ higher than the cadmium atomic proportion $x_2$ of the rest of the semiconductor layer at the same distance from the second surface, removing the support layer and a part of the thickness of the semiconductor layer by means of an etching sensitive to the cadmium atomic proportion such that the second surface of the semiconductor layer has a height difference between the alignment mark, which flushes with the second surface and which corresponds to the second location, and the rest of the second surface, the semiconductor layer thus released from the support layer forming the first support, the first and the second surface of the semiconductor layer forming the first and second faces of said first support.

Thus, with such a method, the alignment mark is positioned at the second location which is itself defined by the arsenic implantation during the formation of the doped zones of the structures of the first support. As a result, the positioning of the alignment mark on the second face of the support is directly related to that of the doping zones of the structures disposed on the first face of the first support.

With a first support obtained by a method according to the invention, it is thus easy to use the alignment mark upon assembling with a second support to ensure a proper alignment between the optical elements of the second support and the structures of the first support.

By etching sensitive to the cadmium proportion, it is meant above and in the rest of this document, an etching method which has an etching rate varying as a function of the cadmium proportion. It will be noted that such a method of etching sensitive to the cadmium proportion comprises, within the scope of the invention, both those having an etching rate which increases when the cadmium proportion increases and those having an etching rate which decreases when the cadmium proportion increases.

By cadmium atomic proportion of a material comprising cadmium, it is meant above and in the rest of this document, the proportion x of cadmium atom from the element(s) of column II of the periodic table making up said material, such a material being generally comprised of element of column II and element of column VI of the periodic table. Thus, in the example of mercury cadmium tellurides $Cd_xHg_{1-x}Te$, x corresponds to the cadmium atomic proportion.

It can be noted that alternatively to the cadmium atomic proportion, it is possible to use the cadmium atomic fraction. Indeed, cadmium containing materials include, to be stable, as many elements of column II of the periodic table as elements of column VI of the periodic table. Thus, a given cadmium atomic proportion x will correspond to an atomic fraction x/2. A material having a cadmium atomic proportion higher than that of another material thus has also a cadmium atomic fraction higher than that of the same other material. Thus, all the inequalities mentioning the cadmium atomic proportion are also valid as regards the cadmium atomic fraction, both these inequality types being thus fully interchangeable.

The first material can comprise at least one first element of column VI of the periodic table and at least one second element of column II of the periodic table including cadmium, cadmium having an atomic proportion $x_1$ of the or said second element(s) of column II of the first material higher than 80% and preferentially higher than 90% or even 95%.

Such a first material enables an efficient diffusion of the support layer to the alignment mark ensuring a significant cadmium atomic proportion difference between the alignment mark and the rest of the semiconductor layer.

The second material can comprise at least one third element of column VI of the periodic table and at least two fourth elements of column II of the periodic table, one of the fourth elements being cadmium, the third element(s) being possibly identical, distinct or partially distinct from the first element(s), and the fourth element(s), in addition to cadmium which is common, being possibly identical, distinct or partially distinct from the second element(s).

The second material can have a cadmium atomic proportion $x_2$ of said fourth elements of column VI of the second material lower by at least 20%, preferentially 30%, or even 40%, than the cadmium atomic proportion $x_1$ of said second element(s).

Such a cadmium proportion difference promotes cadmium diffusion between the alignment mark and the rest of the semiconductor layer.

The first material can be selected from the group including cadmium telluride, cadmium and zinc tellurides of the type $Cd_{x1}Zn_{1-x1}Te$, cadmium selenides-tellurides of the type $CdTe_xSe_{1-x}$, and alloys thereof, the second material being possibly a mercury-cadmium telluride of the type $Cd_{x2}Hg_{1-x2}Te$.

The invention is particularly beneficial for such first and second materials.

During the step of forming an aperture, a remaining thickness D1 of the semiconductor layer at the aperture can be between 0.1 and 2 µm, preferentially between 0.2 and 1 µm, or even 0.4 and 0.8 µm and can be, for example, substantially equal to 0.5 µm.

The step of implanting in a localised manner arsenic of the semiconductor layer can comprise the following sub-steps:
first localised implantation of the semiconductor layer on the first locations and the second location,
second complementary implantation of the semiconductor layer only on the second location.

With such an implantation in two sub-steps, it is possible to decorrelate the concentration of majority carriers of the doped zones and the concentration of arsenic of the alignment mark.

During the step of removing the support layer and a part of the thickness of the semiconductor layer, the selective etching can be a hydrocarbon plasma etching so as to provide an alignment mark projecting from the rest of the second surface of the semiconductor layer, the plasma used for etching being preferentially based on methane and dihydrogen.

During the step of removing the support layer and a part of the thickness of the semiconductor layer, the etching can be a wet chemical etching from an acidic solution comprising a chromium oxide so as to provide an alignment mark in the form of a valley relative to the rest of the second surface of the semiconductor layer.

The invention also relates to a method for manufacturing an optoelectronic component comprising the following steps:
providing a first support implementing a method for manufacturing a first support according to the invention,
providing a second support, the second support including a plurality of optical components, each optical component being corresponding respectively to a respective structure of the first support,
assembling the first and the second support, the second support being aligned with the first support by means of the alignment mark such that each of the optical elements is aligned with the corresponding structure.

Such a method enables an optoelectronic component having a proper alignment between the first and the second support to be provided, by providing a first support according to the invention.

It can also be provided during the implementation of the method for manufacturing a first support, a step of forming on the first surface of the semiconductor layer, first metal contacts of each of the structures, the method for manufacturing an optoelectronic component including, either as such or upon implementing the method for manufacturing a first support, the following steps:

providing a third support including an electronic control and processing circuit and second metal contacts corresponding to the first metal contacts, assembling the first and the third support by an operation of welding or soldering the first contacts to the second contacts, the assembling of the first and the third support being preferentially made by hybridisation through indium balls.

The functionalities of the second support are selected from optical components, or optical elements, including wavelength filters and optical concentration systems, and connection components, or connection elements, such as connection tracks.

In this document, the wording "functionalities", "components" have the same meaning and it is thus possible interchange them without changing the teaching of this document.

Such functionalities particularly benefit from the improved alignment obtained by the implementation of the method according to the invention.

The invention further relates to a first support for forming, in particular with a functionalised second support, an optoelectronic component, the first support having a first and a second face and comprising a semiconductor layer forming said first support, the semiconductor layer having a first and a second surface respectively forming the first and the second face of the first support, the semiconductor layer being made of a second material which comprises a cadmium proportion $x_2$, wherein the semiconductor layer comprises:
a plurality of diode type structures at least one metal contact of which flushes of the first surface, the structures including doped zones each at a first respective location of the semiconductor layer, each doped zone having a second conductivity type in which the holes are the majority carriers, this second conductivity type being provided by means of an arsenic doping.

The semiconductor layer further comprises:
an aperture provided in the semiconductor layer from the first surface towards the second surface,
an alignment mark formed at a second location located in the aperture, the alignment mark having the second conductivity type, the second conductivity type being provided by means of an arsenic doping opening into the second surface, and an average cadmium proportion $x_3$ higher than the average cadmium proportion $x_2$ of the second material at the same distance from the second surface, the alignment mark flushing with the second surface of the semiconductor layer,
and the second surface of the semiconductor layer has a height difference between the alignment mark, which flushes with the second surface and which corresponds to the second location, and the rest of the second surface.

Such a first support is particularly adapted to provide an optoelectronic component with an optimised alignment between its first and second supports.

The alignment mark can be in the form of a valley relative to the rest of the second surface of the semiconductor layer.

The alignment mark can project from the rest of the second surface of the semiconductor layer.

The invention further relates to an optoelectronic component comprising:
a first support according to the invention,
a second support, the second support including functionalisations to be aligned with the structures of the first support.

The first support is assembled through its second face to the second support with the structures aligned with the functionalisations of the second support.

Such an optoelectronic component has an optimised alignment between its first and second supports.

BRIEF DESCRIPTION OF THE DRAWINGS

The present invention will be better understood upon reading the description of exemplary embodiments, given by way of purely indicating and in no way limiting purposes, making reference to the appended drawings in which.

Identical, similar or equivalent parts of the different figures bear the same reference numerals so as to facilitate switching from one figure to the other.

The different parts represented in the figures are not necessarily drawn to a uniform scale, to make the figures more readable.

The different possibilities (alternatives and embodiments) should be understood as being non-exclusive to each other and can be combined to each other.

DETAILED DISCLOSURE OF PARTICULAR EMBODIMENTS

Figure 1:
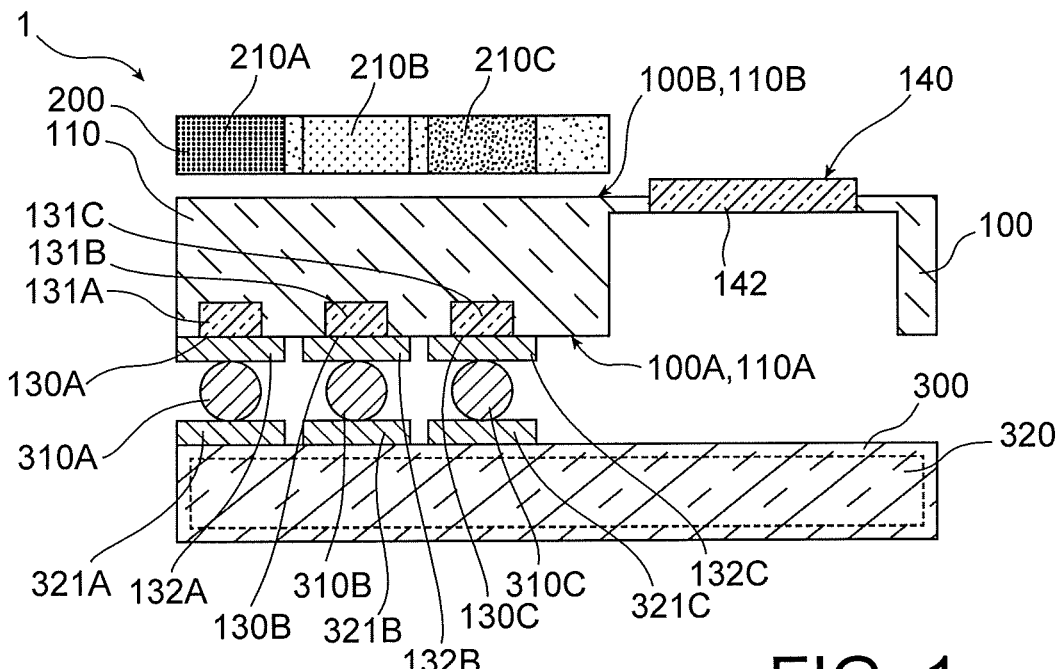
FIG. 1 illustrates a cross-section view of an optoelectronic component according to a first embodiment.

FIG. 1 illustrates an optoelectronic component 1 according to a first embodiment of the invention having an optimised alignment between a first support 100 comprising diode type structures 130A, 130B, 130C and a second support comprising optical elements 210A, 210B, 210C.

The optoelectronic component 1 according to the invention is more particularly dedicated to the detection of electromagnetic radiations the wavelength of which is included in a first wavelength range of infrared range. It will be noted that the infrared range is conventionally divided into three sub-domains that are the near infrared range between 1 and 3 µm, the medium infrared range between 3 and 5 µm and the far infrared range corresponding to wavelengths between 8 and 14 µm.

Thus, if the optoelectronic component 1 according to the invention is particularly adapted to detect photon having its wavelength included in wavelength bands in the infrared range whatever they are, in a conventional application of the invention, the optoelectronic components being in particular possibly configured to detect one or more from the near infrared range, medium infrared range and far infrared range.

Such an optoelectronic component 1 includes:
a first support 100 having a first and a second face and comprising a plurality of diode type structures 130A, 130B, 130C at least one first metal contact 132A, 132B, 132C of which flushes with the first surface 100A and an alignment mark 140 on the second face 100B,
a functionalised second support 200 including a plurality of functionalities, such as a plurality of optical elements 210A, 210B, 210C and assembled to the first support 100 through the second face 100B of the same,
a third support 300 comprising a control and processing circuit 320, not represented, and a plurality of second metal contacts 321A, 321B, 321C, each corresponding to a first metal contact 132A, 132B, 132C of the first support 100, the third support 300 being assembled to the first support 100 through the first face of said first support 100 with each of the first metal contacts 132A, 132B, 132C of the first support 100 aligned and electrically contacted by hybridisation through indium balls 310A, 310B, 310C with the corresponding second metal contact 321A, 321B, 321C of the third support 300.

The first support 100 comprises a semiconductor layer 110 having a first and a second surface 110A, 110B. More precisely, the semiconductor layer forms the support 100, the first and second surfaces 110A, 110B respectively forming the first and the second face 100A, 100B.

The second material can thus comprise at least one third element of column VI of the periodic table and at least two fourth elements of column II of the periodic table, one of the fourth elements being cadmium. In such an arrangement, the second material has a cadmium atomic proportion $x_2$ of said fourth elements of column II.

Thus, the second material can be a mercury-cadmium telluride of the type $Cd_{x2}Hg_{1-x2}Te$.

The cadmium atomic proportion $x_2$ of the semiconductor layer 110 is adapted as a function of the first wavelength range detected by the first component 1. Thus, in the case where the second material is a mercury-cadmium telluride, the cadmium atomic proportion $x_2$ can be chosen as follows:
for a first wavelength range in near infrared, the cadmium atomic proportion $x_2$ is between 0.35 and 0.6,
for a first wavelength range in medium infrared, the cadmium atomic proportion $x_2$ is between 0.28 and 0.35,
for a first wavelength range in far infrared, the cadmium atomic proportion $x_2$ is between 0.18 and 0.26.

Thus, in three practical applications of the invention, the cadmium atomic proportion $x_2$ is set to 0.2, 0.3 and 0.5 respectively.

It will be noted that the composition of the second material is not necessarily constant throughout the thickness of the semiconductor layer 110, wherein the cadmium atomic proportion $x_2$ can decrease from the second surface 110B to the first surface 110A. Such a variation in the cadmium atomic proportion can in particular be related to the method for manufacturing the optoelectronic component according to the invention.

Figure 2A:
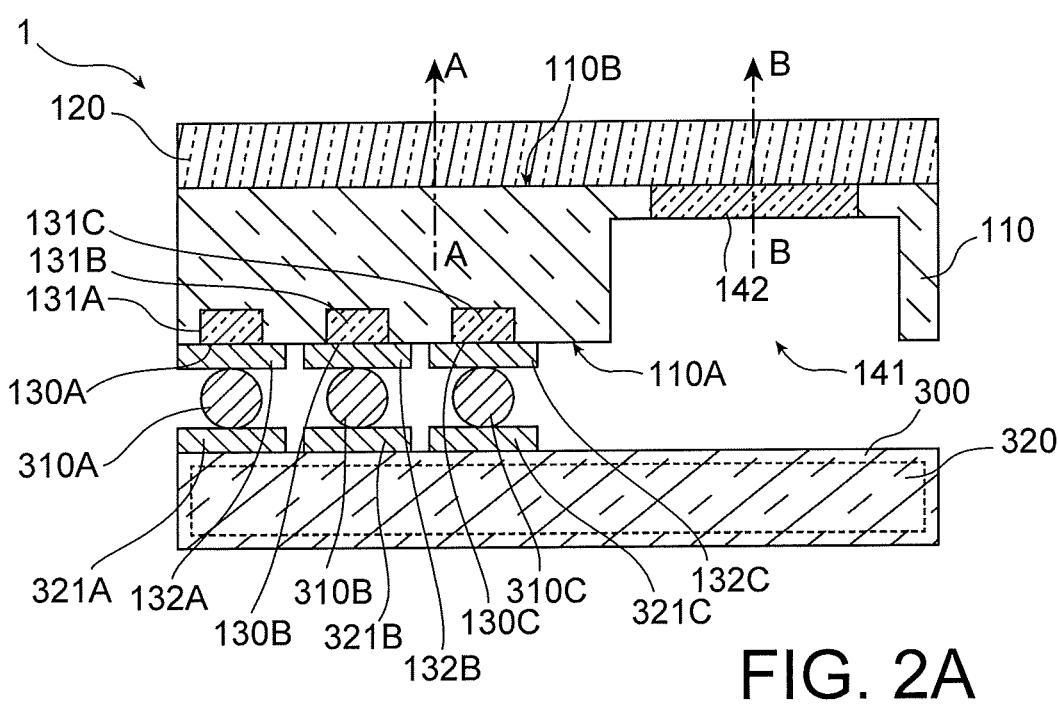
FIGS. 2A and 2B illustrate, for FIG. 2A a cross-section view of a substrate assembled to a third support after a thermal annealing step implemented within the scope of a method for manufacturing an optoelectronic component according to the first embodiment of the invention, and for FIG. 2B the variation in the cadmium proportion along the thickness of the substrate for a first and a second cutaway plane shown in FIG. 2A, FIGS. 3A to 3E illustrate the main steps for manufacturing a first support of an optoelectronic component illustrated in FIG. 1, FIGS. 4A and 4B illustrate two examples of shape of alignment mark conceivable in the context of the invention, FIGS. 5A and 5B respectively illustrate by cross-section views a first support and an optoelectronic component according to a second embodiment in which an alignment mark is present on a second face of the first support as a valley provided in said second face.

Indeed, as shown in FIG. 2A, the semiconductor layer 110 is provided by means of a substrate 100 comprising said semiconductor layer 110 made of the second material and a support layer 120 in contact with the semiconductor layer 110 on the second surface 110B of said semiconductor layer 110. The support layer 120 is made of a first material comprising cadmium Cd with a cadmium Cd atomic proportion $x_1$ higher than the cadmium Cd atomic proportion $x_2$ of the second material.

Thus, the first material can comprise at least one first element of column VI of the periodic table and at least one second element of column II of the periodic table including cadmium Cd, the first material having a cadmium atomic proportion $x_1$ of said second elements of column II higher than 80% and preferentially higher than 90% or even 95%.

The second material has a cadmium atomic proportion $x_2$ lower by at least 20%, preferentially 30%, or even 40%, than the cadmium atomic proportion $x_1$ of the first material. In other word, the cadmium atomic proportion $x_2$ satisfies the following inegality: $x_2<x_1-20\%$. Preferably, the cadmium atomic proportion $x_2$ one or both following inegalities: $x_2<x_1-30\%$ or $x_2<x_1-40\%$.

Since the method for manufacturing the optoelectronic component 1 can involve a heat treatment step, a cadmium Cd diffusion of the support layer 120 into the semiconductor layer 110 at the interface between the support layer 120 and the semiconductor layer 110 can result from such a step.

Figure 2B:
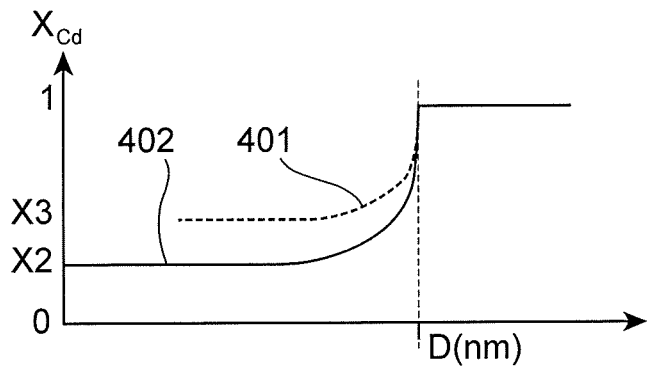

Thus, as shown in FIG. 2B illustrating in solid lines the variation in the cadmium atomic proportion $x_2$ along the thickness of the semiconductor layer 110 along the sectional plane AA' of FIG. 2A, the cadmium atomic proportion $x_2$ of the semiconductor layer 110 increases towards the interface between the semiconductor layer 110 and the support layer to reach, at the interface between the first and second materials, the cadmium atomic proportion $x_1$ of the first material.

It will be noted that in such a substrate 100, the first material is adapted to form by epitaxial deposition the semiconductor layer 110 in contact with the support layer 120. Thus, the first material can be selected from the group including cadmium telluride CdTe, cadmium and zinc tellurides of the type $Cd_{x1}Zn_{1-x1}Te$, cadmium selenides-tellurides of the type $CdTe_{x1}Se_{1-x1}$, and alloys thereof.

In this first embodiment, the second material includes at least one doping element of a first conductivity type in which the majority carriers are electrons. In other words, the second material is N-doped. The second material can have a concentration of electron donor dopant elements between $1 \cdot 10^{13}$ and $1 \cdot 10^{17}$ cm$^{-3}$, or even between $5 \cdot 10^{14}$ and $4 \cdot 10^{15}$ cm$^{-3}$. Thus, for example, the second material can have a concentration of majority carriers substantially equal to $1 \cdot 10^{15}$ cm$^{-3}$.

The semiconducting layer 110 includes the plurality of diode type structures 130A, 130B, 130C flushing with the first surface 110A and the alignment mark.

Each of the structures 130A, 130B, 130C comprises:
a doped zone 131A, 131B, 131C provided from a first respective location of the first surface 110A, a first metal contact 132A, 132B, 132C of the doped zone 131A, 131B, 131C of said structure 130A, 130B, 130C and adapted to contact with a corresponding metal contact of the third support 300 by hybridisation through indium balls.

It will be noted that the semiconductor layer 110 further includes one or more third metal contacts, not shown, adapted to enable a bias to be applied to said semiconductor layer. Thus, each of the structures 131A, 131B, 131C can be biased by means of its first metal contact 132A, 132B, 132C and the third metal contact which is a collective metal contact.

Each of the doped zones 131A, 132B, 132C comprises arsenic As as a dopant element in order to provide a doping of a second conductivity type for which the majority carriers are holes. In other words, each of the doped zones 131A, 131B, 131C has a P doping.

Each of the doped zones 131A, 131B, 131C is provided by implanting arsenic As with a dose between $1·10^{13}$ and $1·10^{16}$ cm$^{-2}$. The implantation dose can for example be between $5·10^{14}$ and $5·10^{15}$ cm$^{-2}$ and is preferentially substantially equal to $1·10^{15}$ cm$^{-2}$.

With such a dose, the concentration of arsenic As in doped zones can be between $2·10^{15}$ and $2·10^{18}$ cm$^{-3}$, or even between $1·10^{17}$ and $1·10^{18}$ cm$^{-3}$ and preferentially substantially equal to $2·10^{17}$ cm$^{-3}$.

According to a first possibility of this first embodiment, the doped zones extend from a first location of the first surface on a thickness of the first surface equal to D2. Alternatively, according to a second possibility of this first embodiment, not illustrated, the doped zones can be at least partially buried, the doped zones being provided by implanting arsenic As remotely of the first surface 110A. According to this alternative, the first metal contacts, flushing with the first surface 110A, extend into the semiconductor layer 110 so as to reach the corresponding doped zones.

The semiconductor layer 110 further comprises an aperture 141 provided from the first surface 110A towards the second surface 110B, a remaining thickness of the semiconductor layer 110 at the aperture 141 being lower than or equal to a value D1 which is itself lower than or equal to D2. In other words, the remaining thickness at the aperture 141 is lower than or equal to D2.

It will be noted that the value D1 can be between 0.1 and 2 µm, preferentially between 0.2 and 1 µm, or even 0.4 and 0.8 µm and can be, for example, substantially equal to 0.5 µm.

The semiconductor layer 110 also includes an alignment mark 140 formed at a second location 142 located in the aperture 141. The alignment mark 142 is P-doped, the doping element of said zone being arsenic As. According to a first possibility of this first embodiment, the dose of implanted arsenic and thus the concentration of dopant element of the alignment mark are substantially identical to that of the doped zones 131A, 131B, 131C.

Alternatively to this first embodiment, the arsenic As implantation on the first locations and the second location can be made in several sub-steps, a first sub-step during which the first locations and the second location are implanted with a first arsenic dose, and a second sub-step in which only the second location is implanted with a complementary second dose. Thus, according to this alternative, the doped zones 131A, 131B, 131C and the alignment mark 140 can have a concentration of majority carriers distinct from each other, the alignment mark thereby having a concentration of majority carriers higher than that of the doped zones 131A, 131B, 131C.

It will be noted that the second location 142 has a lower dimension than that of the aperture 141.

The alignment mark 140 further includes an average cadmium atomic proportion $x_3$ higher than that of the rest of the semiconductor layer 110. This atomic proportion difference is obtained by a cadmium Cd diffusion from the support layer 120 promoted by the presence of arsenic As in the alignment mark 142 during the heat treatment step.

FIGS. 2A and 2B illustrate this diffusion phenomenon promoted by arsenic As. FIG. 2A thus illustrates the support after the heat treatment step and shows a first sectional plane AA' along the semiconductor layer 110 outside the second location 142 and a second sectional plane BB' along the semiconductor layer 110 intersecting the second location 142. FIG. 2B illustrates as a solid line and a dotted line the variation in the cadmium Cd atomic proportion along the semiconductor layer 110 at the plane AA' and the plane BB' respectively. Thus, it can be observed that the arsenic As doping at the second location 142 enabled cadmium diffusion to be promoted with respect to the rest of the semiconductor layer 110, the cadmium atomic proportion $x_3$ being more important at a given depth than in the rest of the semiconductor layer 110 at the same depth.

Thus, the alignment mark 140 has a cadmium atomic proportion $x_3$ higher than the cadmium atomic proportion $x_2$ of the rest of the semiconductor layer 110 at the same distance from the second surface 110B.

For more information about this phenomenon used within the scope of the invention relating to cadmium Cd diffusion promoted by the presence of arsenic As, the reader can refer to the work by L. Mollard and co. published in 2009 in the scientific journal "Journal of Electronic Materials" volume 38 number 8 pages 1805-1813.

In such a diffusion, a difference $x_3$–$x_2$ of cadmium atomic proportion results between the alignment mark 140 and the rest of the semiconductor layer 110.

Thus, the following conditions can for example be taken:
a first material has a cadmium atomic proportion $x_1$ higher than 0.95, for example a cadmium and zinc telluride of the type $Cd_{x1}Zn_{1-x1}Te$ with a cadmium atomic proportion $x_1$ equal to 0.96,
a second material having a cadmium atomic proportion $x_2$ respectively of 0.2, 0.3 and 0.5 to 0.6, for example a mercury-cadmium telluride of the type $Cd_{x2}Hg_{1-x2}Te$.

Under these conditions, in accordance with the works by L. Mollard and co., a cadmium atomic proportion in the alignment mark 140 of 0.4, 0.5 and 0.6 to 0.8 can be expected for the cadmium proportion values of 0.2, 0.3 and 0.5 to 0.6. In other words, a proportion difference of about 0.2, that is an atomic fraction difference of about 0.1.

As illustrated in FIG. 1, the second surface 110B of the semiconductor layer 110 has a height difference between the alignment mark 140, which flushes with the second surface 110B and which corresponds to the second location 142, and the rest of the second surface 110B. Thus, as shown in FIG. 1, in this first embodiment, the alignment mark 110 projects from the rest of the second surface 110B of the semiconductor layer 110.

Such a projection of the alignment mark 140 relative to the rest of the second surface 110B is achieved, within the scope of the invention, by the use of a method of etching sensitive to the cadmium Cd atomic proportion. More precisely, the etching method employed is an etching method which has an etching rate which decreases for a cadmium atomic proportion which increases.

Thus, according to this first embodiment, the etching method employed can be a hydrocarbon plasma etching method such as a plasma based on methane $CH_4$ and dihydrogen $H_2$. Indeed, As shown by the works by F. Boulard and co. published in 2010 in the scientific journal "Journal of Electronic Materials" Volume 39 Number 8 pages 1256-1261, with a plasma comprised of methane and dihydrogen, the etching rate has a strong dependence on the cadmium composition. Thus, it has been observed within the scope of these works that the etching rate was:

100 nm·min$^{-1}$ for a cadmium atomic proportion of 0.6,
220 nm·min$^{-1}$ for a cadmium atomic proportion of 0.3,
300 nm·min$^{-1}$ for a cadmium atomic proportion of 0.23.

Based on this and if a second material having a cadmium atomic proportion of 0.23 and an alignment mark 140 having a cadmium atomic proportion 0.3 are taken as an example, it is possible to achieve a height difference between the alignment mark 140 and the rest of the first surface 110B of 80 nm after 1 min of etching of the interface 110B.

Of course, the etching is configured to provide a partial etching of the rest of the semiconductor layer 110 at the aperture. In other words, the etching is configured to provide an etching of the semiconductor layer, either at the second location or on the rest of the second surface, on a thickness lower than D1.

In the same way, according to a preferred mode of the invention, the etching is configured to provide a height difference between the alignment mark 140 and the rest of the surface which is between 10 and 500 nm, or even between 50 and 300 nm.

Such a height difference is perfectly identifiable with alignment tools available to those skilled in the art and thus offers the possibility of aligning the second support with respect to the second face 110B of the first support 100 and its structures 130A, 130B, 130C despite the fact that said structures are only accessible on the first face 100A of the first support.

It will further be noted that such an etching method by a plasma based on methane $CH_4$ and dihydrogen $H_2$ is particularly advantageous because it has, in addition to an etching rate dependant on the cadmium proportion Cd, the generation of a roughness also dependent on the same proportion. Thus, the roughness variation is related to the cadmium proportion difference between the alignment mark 140 and the rest of the second surface 110.

According to a first possibility of this first embodiment, the second support 200 comprises a plurality of optical elements 210A, 210B, 210C each configured to be associated with a respective structure 130A, 130B, 130C of the semiconductor layer 100. These optical elements 210A, 210B, 210C are adapted to intersect an electromagnetic radiation coming from the second support 200 and modify a property thereof, either by filtering or by modifying its direction to, for example, converge it to the corresponding structure 130A, 130B, 130C. Thus, each optical element 210A, 210B, 210C can be selected from the group comprising wavelength filters and lenses. It will be noted that since these types of optical element are well known to those skilled in the art, it is not necessary to describe them further.

In this document, by "optical element" and "optical component" it is mean the same type of component, both wording being interchangeable without changing the teaching of this document.

According to an alternative not illustrated of this first embodiment, the second support 200 can be functionalised in another way with a plurality of optical elements, the second support 200 including, for example an array of conductive tracks for enabling third metal contacts of the structures 130A, 130B, 130C disposed at the second surface 1106 of the first support 100 to be connected. According to this alternative, the second support being made of a material transparent to the detection wavelength of the structures 130A, 130B, 130C, and the conductive tracks are arranged so as not to interfere with the electromagnetic radiation coming from each of the structures 130A, 130B, 130C. In the same way, the conductive tracks can be made of a material transparent to the detection wavelength of the structures 130A, 130B, 130C.

Since this alternative is perfectly compatible with the presence of a plurality of optical elements 210A, 2108, 210C, according to another alternative of this first embodiment not illustrated, the second support 200 can include both an array of conductive tracks, in order to allow a connection of the third metal contacts of the structures 130A, 130B, 130C, and optical elements 210A, 210B, 210C, the conductive tracks being thereby arranged between the optical elements 210A, 210B, 210C.

The second support 200 is aligned with the first support 100 by means of the alignment mark 140 of the first support 100. In this way, the alignment between each optical element 210A, 2108, 210C and the structure 130A, 130B, 130C is reliable with a low or zero interaction, between an optical element 210A, 210B, 210C and the structures 130A, 130B, 130C adjacent to the corresponding structure that a misalignment causes.

The third support 300 includes;
the control and processing circuit 320 adapted to powered the structures 130A, 130B, 130C of the first support and process the signals generated by the same when they receive an electromagnetic radiation in the first wavelength range,
the plurality of second metal contacts 321A, 321B, 321C arranged on a face of the third support 300.

The second metal contacts 321A, 321B, 321C are in electrical and mechanical contact, provided by hybridisation through indium balls 310A, 310B, 310C, with the corresponding first metal contacts 132A, 132B, 132C of the first support 100.

Since this processing support type being part of the third support 300 is known to those skilled in the art and is in no way the subject of the present document, it is not necessary to describe it further.

Such an optoelectronic component 1 according to this first embodiment can be provided by implementing a manufacturing method including the following steps:
providing the first support 100 comprising the semiconductor layer 110,
providing the third support 300,
assembling the semiconductor layer 110 through its first surface 110A to the third support 300 by hybridisation through indium balls of the metal contacts 132A, 132B, 132C,
providing the second support 200,
assembling the second support 200 to the second face of the first support 100, the alignment between the first and the second support 100, 200 being in particular achieved by means of the alignment mark 140 of the first support 100.

Of course, the order of these steps is only provided by way of indicating purposes, and the assembly of the first and the third support 100, 300 can for example be made after the assembling step. It will be also noted that some of these steps can also be, without departing from the scope of the invention, concomitant. Thus, for example, as will be described in connection with FIGS. 3A to 3E, providing the third support 300 and assembling the semiconductor layer can be made within the scope of the step of providing the first support 100.

Figure 3A:
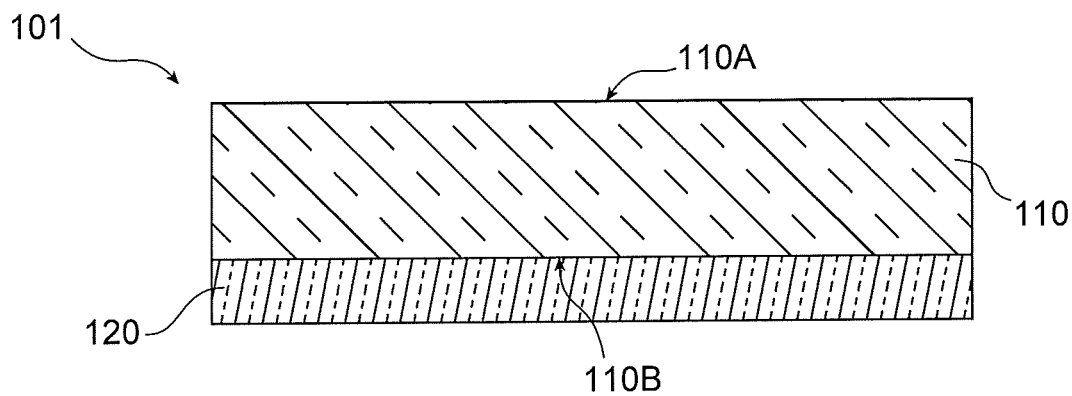
Figure 3B:
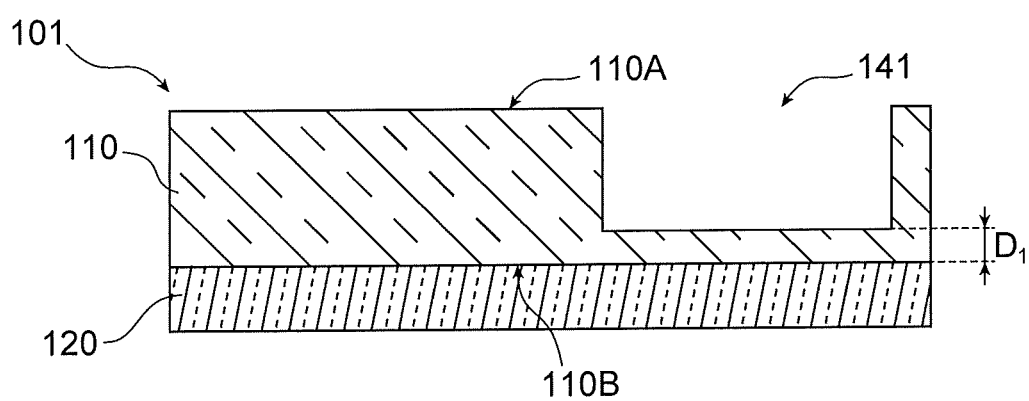
Figure 3C:
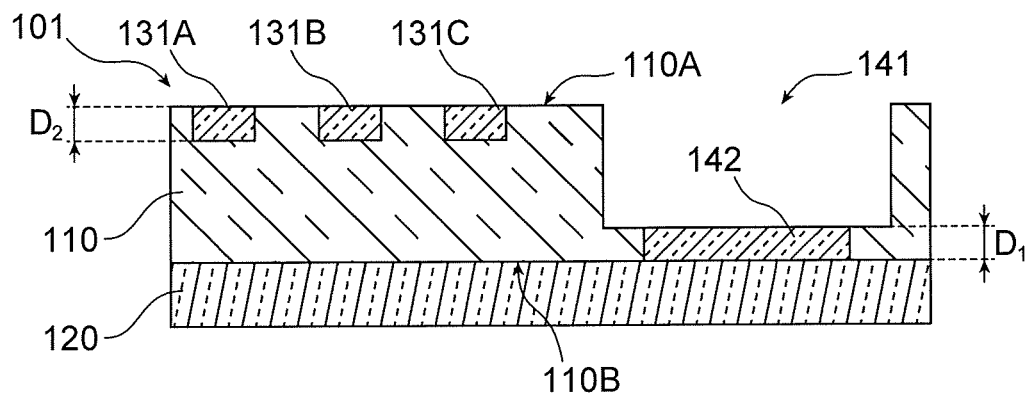
Figure 3D:
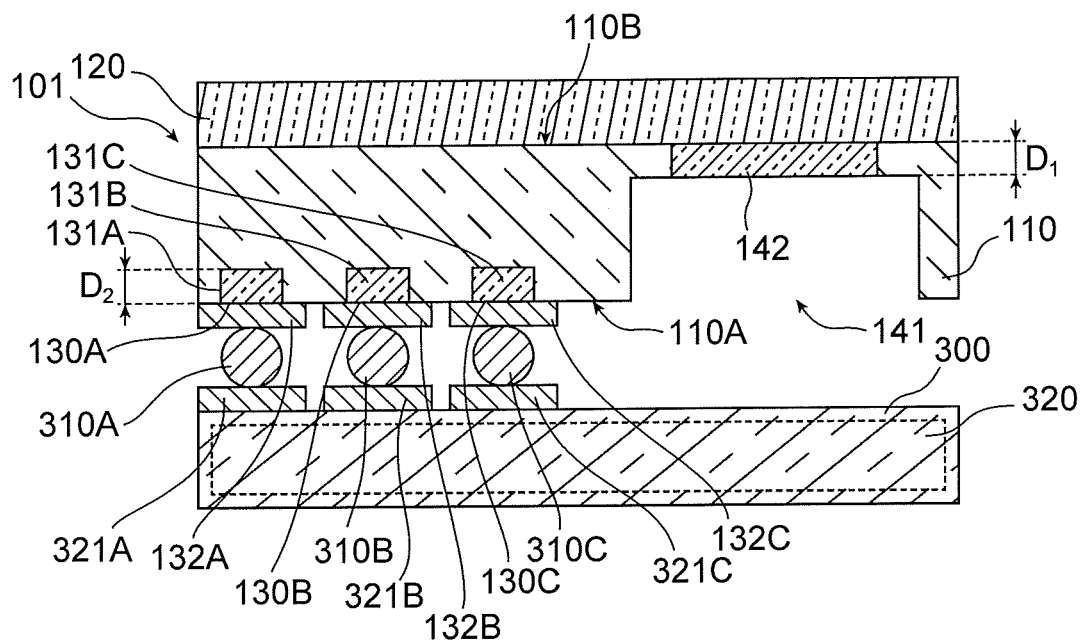
Figure 3E:
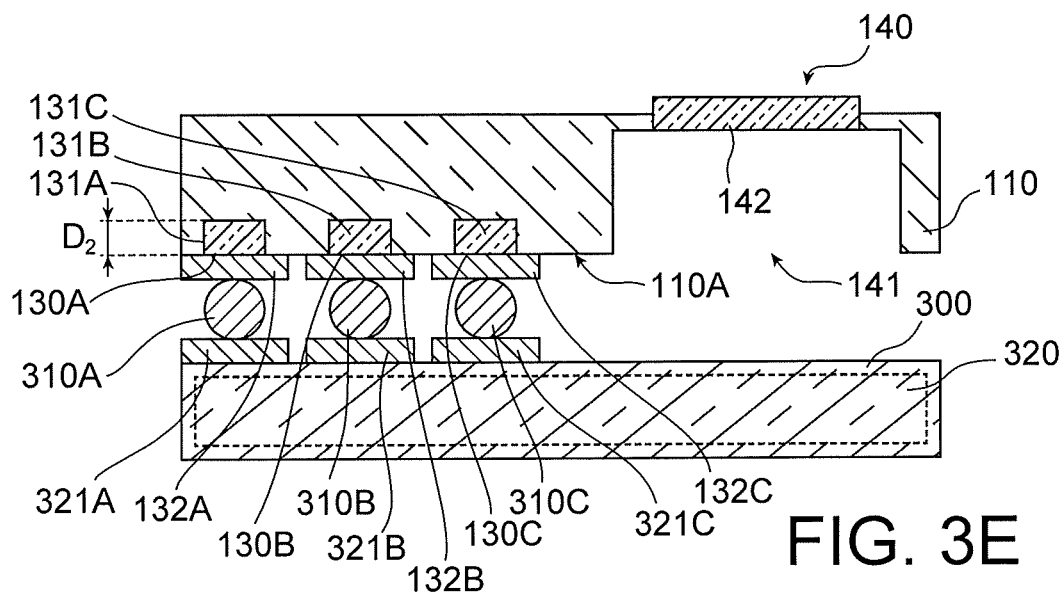

Providing the first support 100 can be achieved, as illustrated in FIGS. 3A to 3E, by implementing a method for manufacturing such a first support 100. In this first embodiment, the method for providing such a first support includes the following steps:

providing a substrate 101, the substrate 101 comprising a support layer 120 made of a first material comprising cadmium Cd and a semiconductor layer 110 having a first and a second surface 110A, 110B and being in contact with the support layer 120 through its second surface 110B, the semiconductor layer 110 being made of the second material which comprises a cadmium atomic proportion $x_2$ lower than a cadmium atomic proportion $x_1$ of the first material and has a N doping, as illustrated in FIG. 3A, forming an aperture 141 in the semiconductor layer 110 from the first surface 110A towards the second surface 110B, a remaining thickness of the semiconductor layer 110 at the aperture 141 being equal to D1, as illustrated in FIG. 3B, implanting in a localised manner arsenic of the semiconductor layer 110 through the first surface 110A on a plurality of first locations 131A, 131B, 131C of the semiconductor layer 110 and at a second location 142 located in the aperture 141 for forming the structures 130A, 130B, 130C and an alignment mark respectively, the localised implantation reaching the second surface 110B in the second location 142, providing the third support 300, assembling the semiconductor layer 110 through its first surface 110A to the third support 300 by hybridisation through indium balls of the metal contacts 132A, 132B, 132C, heat treating able to activate the arsenic implanted on the plurality of first locations 131A, 131B, 131C to form P-doped zones and thus form the plurality of structures 130A, 130B, 130C corresponding to said doped zones 130A, 130B, 130C, the heat treatment being also adapted to allow cadmium diffusion from the support layer 120 to the second location 142, said diffusion being favoured by the arsenic implanted in said second location 142 and enabling the alignment mark 140 flushing with the second surface to be provided and with a cadmium atomic proportion $x_3$ higher than the cadmium atomic proportion $x_2$ of the rest of the semiconductor layer 110 at the same distance from the second surface (110B), as illustrated in FIG. 3D, removing the support layer 120 and a part of the thickness of the semiconductor layer 110 by means of an etching sensitive to the cadmium atomic proportion such that the second surface 110B of the semiconductor layer 110 has a height difference between the alignment mark 140, which flushes with the second surface 110B and which corresponds to the second location 142, and the rest of the second surface 110B, the semiconductor layer 110 thus released from the support layer 120 forming the first support 100, the first and the second surface 110A, 110B of the semiconductor layer 110 forming the first and second faces 100A, 100B of said first support 100, as illustrated in FIG. 3E.

It will be noted that, as has already been indicated, in this first embodiment and during the step of removing the support layer 120 and a part of the semiconductor layer 110, the etching sensitive to the cadmium Cd proportion is adapted to have an etching rate which decreases when the cadmium proportion increases. In this way, après the step of removing the support layer 120 and a part of the semiconductor layer 110, the alignment mark projects from the rest of the second surface 110B of the semiconductor layer 110.

It will be also noted that in the configuration of this first embodiment, as illustrated in FIG. 3C, the implantation is made on the first locations and the second location during a single step and on a depth D2 higher than or equal to D1, this being equal to D1 in FIG. 3C.

Alternatively, the implantation can be made in two sub-steps, a first sub-step during which the arsenic As implantation is made at the same time on the first locations and the second location, and a second sub-step during which the arsenic As implantation is only made on the second location. To make such an implantation in two sub-steps, it is possible to use a same implantation mask for the first and second sub-steps, the apertures of the mask corresponding to the first locations being plugged by the use, for example, of a complementary mask. According to this alternative, only the second sub-step corresponding to the complementary implantation is necessarily made at a depth D2 higher than or equal to D1.

Figure 4A:
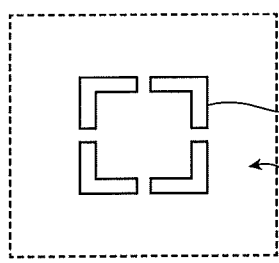
Figure 4B:
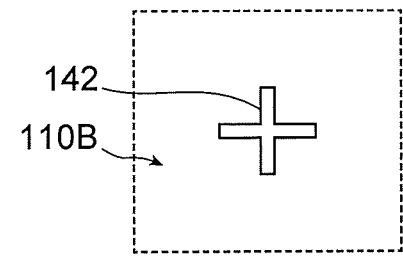

FIGS. 4A and 4B illustrate two non-limiting examples of a shape of the marking zones 140 compatible with the method of the invention. Thus, the alignment mark 140 illustrated in FIG. 4A is a square having, in the centre of each of its sides, an interruption. According to the second example, illustrated in FIG. 4B, the alignment mark 140 can take the form of a cross the dimensions of which can be between 1 and 100 µm, or even between 20 and 50 µm. Of course, both these examples are purely indicating and any types of shape known to those skilled in the art to allow alignment of a first substrate with respect to a second substrate is of course conceavable within the scope of the invention.

Figure 5A:
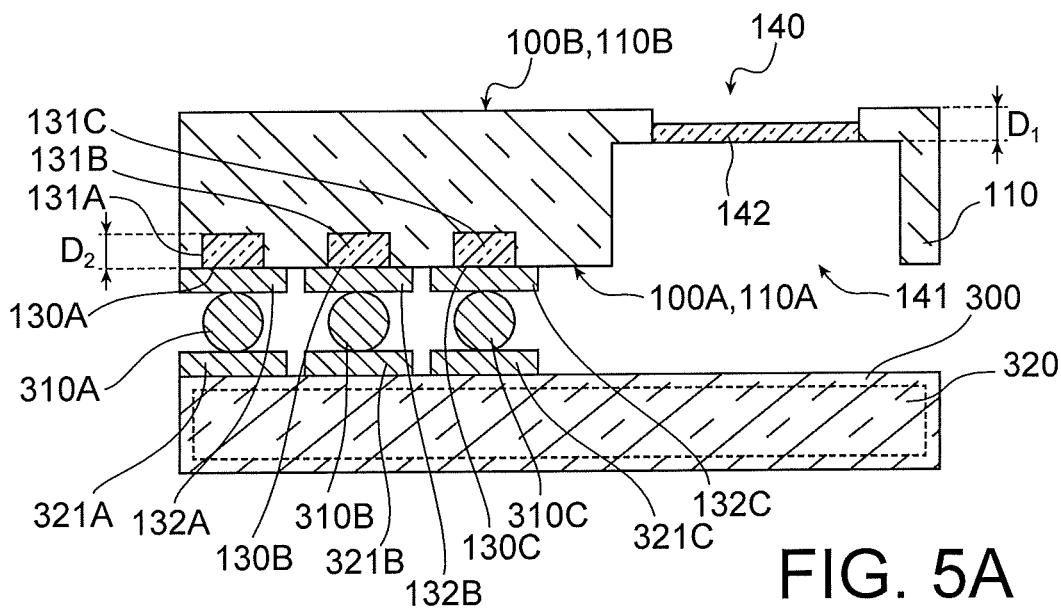
Figure 5B:
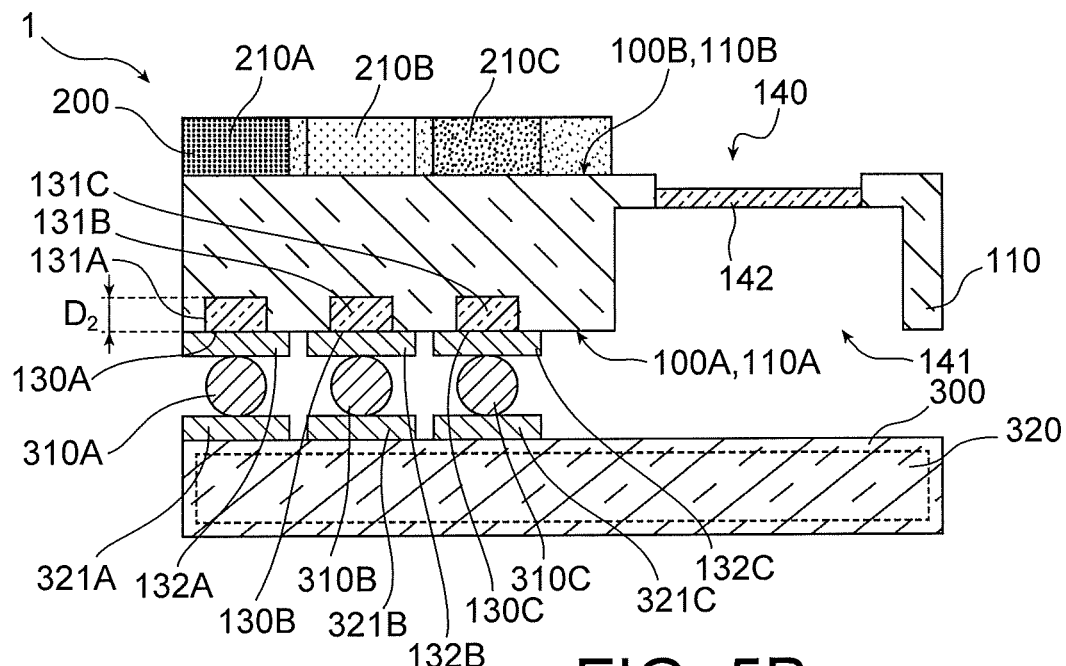

FIGS. 5A and 5B illustrate a cross-section view respectively of a first support 100, assembled to a third support 300, and an optoelectronic component 1 according to a second embodiment of the invention. An optoelectronic component 1 according to this second embodiment is differentiated from an optoelectronic component 1 according to the first embodiment in that the alignment mark 140 is in the form of a valley relative to the rest of the second surface 110B of the semiconductor layer 110.

Thus, in this second embodiment, the alignment mark 140 is in the form of a valley relative to the rest of the second surface 110B of the semiconductor layer 110. Such a shape of the alignment mark 140 is provided using, during the step of removing the support layer 120 and a part of the semiconductor layer 110, an etching sensitive to the cadmium Cd proportion which is adapted to have an etching rate which increases when the cadmium atomic proportion increases.

Such an etching can, for example, be a wet chemical etching from an acidic solution comprising a chromium oxide. Indeed, as demonstrated by the work by J. D. Benson and co. published in 2010 in the scientific journal "Journal of Electronic Materials" Volume 39 number 7 pages 1080-1086, an etching from such a solution has an etching rate of materials comprising cadmium which increases with an increase in the cadmium atomic proportion. It will be noted that J. D. Benson has in particular use to make such a demonstration a solution comprising water $H_2O$, nitric acid $HNO_3$, hydrofluoric acid HF, hydrochloric acid HCl and chlorine trioxide $CrO_3$.

Thus, the method for manufacturing a component 1 according to this second embodiment is differentiated from a method according to the first embodiment in that during the step of removing the support layer 120 and a part of the semiconductor layer 110, the etching sensitive to the cadmium Cd proportion is adapted to have an etching rate which increases when the cadmium atomic proportion increases.

Figure 6:
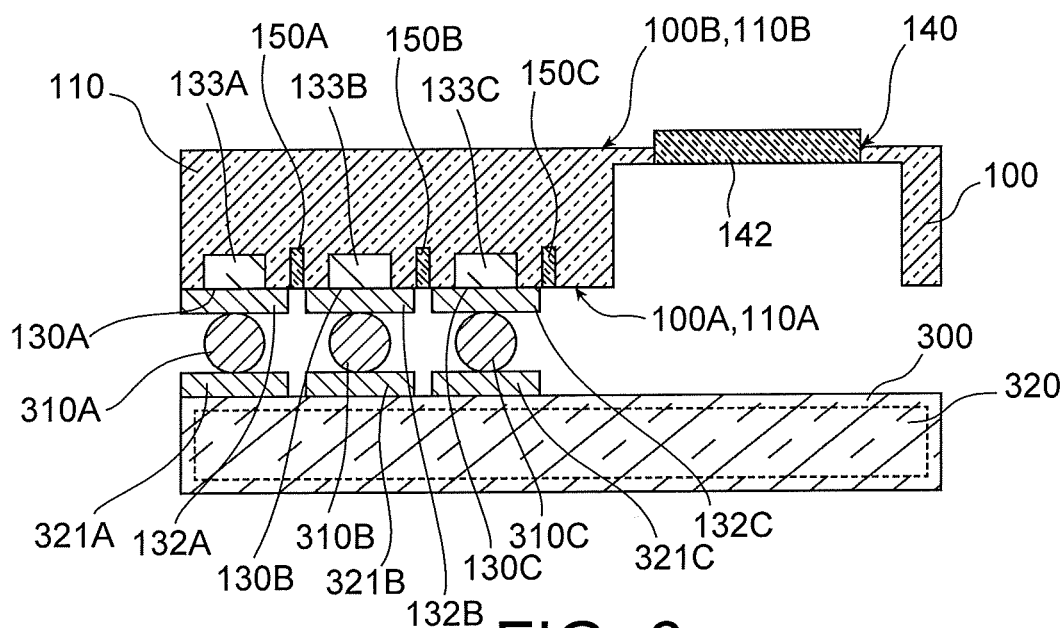
FIG. 6 illustrates an optoelectronic component according to a third embodiment in which the semiconductor layer is P-doped, the doped zones being arranged to insulate the structures from each other.

FIG. 6 illustrates an optoelectronic component 1 according to a third embodiment in which the semiconductor layer 110 is P-doped, the structures 130A, 130B, 130C comprising a N-doped second zone 133A, 133B, 133C for each of them and P-doped zones forming insulation lines of the structures 130A, 130B, 130C. These lines can also form a conduction array to evenly bias the semiconductor layer 110. An optoelectronic component 1 according to this third embodiment is differentiated from an optoelectronic component 1 according to the first embodiment in that:
- the semiconductor layer 110 is P-doped and thus includes the second conductivity type,
- the alignment mark has a concentration of majority carriers higher than that of the semiconductor layer 110,
- the structures 130A, 130B, 130C, each of the structures 130A, 130B, 130C including:
  - a N-doped second zone 133A, 133B, 133C to form, with the rest of the semiconductor layer a diode,
  - the doped zones 150A, 150B, 150C having a P doping, with a concentration of majority carriers higher than that of the semiconductor layer 110, and forming conduction and insulation lines interposed between said structure and the adjacent structures,
  - a first metal contact 132A, 132B, 132C of the second zone 133A, 133B, 133C,
  - a third metal contact, preferentially common to at least one group of structures, not illustrated, of the P-doped zones.

Thus, in this third embodiment, the semiconductor layer 110 has a P doping with a concentration of electron acceptor doping elements between $5 \cdot 10^{15}$ and $1 \cdot 10^{17}$ cm$^{-3}$.

The doped zones 150A, 150B, 150C have a concentration of arsenic, thus of electron acceptor doping elements, between $5 \cdot 10^{17}$ and $1 \cdot 10^{19}$ cm$^{-3}$. These doped zones 150A, 150B, 150C are arranged so as to delimit each of the structures and insulate them from each other in order to limit, or even remove the crosstalk phenomena. In this third embodiment, the doped zones have a thickness between 0.1 and 1 µm.

For more information about the configuration of a structure according to this third embodiment, document WO 2013/079447, which relates to structures including such conduction lines, is referred to.

In a similar way to the doped zones, the alignment mark has a doping higher than that of the semiconductor layer 110. Thus, the alignment mark can have a concentration of arsenic, thus of electron acceptor doping elements, between $5 \cdot 10^{17}$ and $1 \cdot 10^{19}$ cm$^{-3}$.

The method for manufacturing a component according to this third embodiment is differentiated from a manufacturing method according to the first embodiment in that it further includes a step of forming the N-doped second zones 133A, 133B, 133C and in that during the arsenic As implantation step, the first locations are arranged so as to delimit each of the structures.

Alternatively to this third embodiment, in accordance with the teaching of document WO 2013/079447, the doped zones can be arranged to delimit sets of structures 130A, 130B, 130C, for example a set of four structures.

It will be noted that, whatever the embodiment, during the implantation step on the first locations and the second location, the first locations correspond to zones for forming and/or delimiting at least one structure 130A, 130B, 130C of the optoelectronic component 1.

The invention claimed is:

1. A method for manufacturing a first support for forming, in particular with a second support, an optoelectronic component, the first support having a first face and a second face and comprising a plurality of diode type structures with at least one metal contact of each structure being flush with the first surface, and an alignment mark on the second face able to allow alignment with the second support upon assembling the first support through the second face to the second support for forming the optoelectronic component,
the method comprising the following steps of:
providing a substrate, the substrate comprising a support layer made of a first material comprising cadmium, and a semiconductor layer having a first and a second surface and being in contact with the support layer through the second surface of the semiconductor layer, the semiconductor layer being made of a second material comprising a second cadmium atomic proportion lower than a first cadmium atomic proportion of the first material,
forming an aperture in the semiconductor layer from the first surface towards the second surface,
implanting in a localised manner arsenic into the semiconductor layer through the first surface on a plurality of first locations of the semiconductor layer, each first location corresponding to a structure, and on a second location, corresponding to the alignment mark, the localised implantation reaching the second surface in the second location,
heat treating able to activate the implanted arsenic on the plurality of first locations to form doped zones of a second conductivity type in which the majority carriers are holes, said doped zones participating in forming the structures corresponding to said doped zones, the heat treating being also adapted to allow cadmium diffusion from the support layer to the second location, the cadmium diffusion being promoted by the arsenic implanted in said second location and allowing providing the alignment mark being flush with the second surface and with a third cadmium atomic proportion higher than the second cadmium atomic proportion of the rest of the semiconductor layer at the same distance from the second surface, and
removing the support layer and a part of the thickness of the semiconductor layer by means of an etching sensitive to cadmium atomic proportion such that the second surface of the semiconductor layer has a height difference between the alignment mark, which is flush with the second surface and which corresponds to the second location, and the rest of the second surface, the semiconductor layer thus released from the support layer forming the first support, the first and the second surface of the semiconductor layer forming the first and second faces of said first support.

2. The method for manufacturing a first support according to claim 1, wherein the first material comprises at least one first element of column VI of the periodic table and at least one second element of column II of the periodic table including cadmium, cadmium having an atomic proportion of the second element(s) of column II of the first material higher than 80%.

3. The method for manufacturing a first support according to claim 2, wherein the second material comprises at least one third element of column VI of the periodic table and at least two fourth elements of column II of the periodic table, one of the fourth elements being cadmium, the third element(s) being possibly identical, distinct or partially distinct from the first element(s), and the fourth element(s), in addition to cadmium which is common, being possibly identical, distinct or partially distinct from the second element(s), wherein the second material has the second cadmium atomic proportion of said fourth elements of column II of the second material lower by at least 20% than the first cadmium atomic proportion of the second element(s).

4. The method for manufacturing a first support according to claim 2, wherein the first material is selected from the group including cadmium telluride, cadmium and zinc tellurides of the type $Cd_{x1}Zn_{1-x1}Te$, cadmium selenides-tellurides of the type $CdTe_xSe_{1-x}$, and alloys thereof, wherein the second material is a mercury-cadmium telluride of the type $Cd_{x2}Hg_{1-x2}Te$, and wherein $x_1$ is the first cadmium atomic proportion and $x_2$ is the second cadmium atomic proportion.

5. The method for manufacturing a first support according to claim 1, wherein during the step of forming an aperture, a remaining thickness D1 of the semiconductor layer at the aperture is between 0.1 and 2 μm.

6. The manufacturing method according to claim 1, wherein the step of implanting in a localised manner arsenic of the semiconductor layer comprises the following substeps:

first localised implantation of the semiconductor layer on the first locations and the second location, and second complementary implantation of the semiconductor layer only on the second location.

7. The method for manufacturing a first support according to claim 1, wherein during the step of removing the support layer and a part of the thickness of the semiconductor layer, the selective etching is hydrocarbon plasma etching so as to provide an alignment mark projecting from the rest of the second surface of the semiconductor layer.

8. The method for manufacturing a first support according to claim 7, wherein the plasma used for etching is based on methane and dihydrogen.

9. The method for manufacturing a first support according to claim 1, wherein during the step of removing the support layer and a part of the thickness of the semiconductor layer, the etching is a wet chemical etching from an acidic solution comprising a chromium oxide so as to provide an alignment mark in the form of a valley relative to the rest of the second surface of the semiconductor layer.

10. A method for manufacturing an optoelectronic component comprising the following steps:

providing a first support implementing a method for manufacturing a first support according to claim 1, providing a second support, and assembling the first and the second support, the second support being aligned with the first support by means of the alignment mark.

11. The method for manufacturing an optoelectronic component according to claim 10, wherein it is further provided during the implementation of the method for manufacturing a first support, a step of forming on the first surface of the semiconductor layer, first metal contacts of each of the structures, the method for manufacturing an optoelectronic component including, either as such or upon implementing the method for manufacturing a first support, the following steps:

providing a third support including an electronic control and processing circuit and second metal contacts corresponding to the first metal contacts, and assembling the first and the third support by an operation of welding or soldering the first contacts to the second contacts.

12. The method for manufacturing an optoelectronic component according to claim 10, wherein the second support includes a plurality of components, each components corresponding with a respective structure of the first support, the components being selected from optical component including wavelength filters and optical concentration systems, and connection components including connection tracks and connection pads.

13. A first support for forming with a second support, an optoelectronic component, the first support having a first and a second face and comprising a semiconductor layer forming the first support, the semiconductor layer having a first and a second surface respectively forming the first and the second face of the first support, the semiconductor layer being made of a second material which comprises a second cadmium proportion, wherein the semiconductor layer comprises:

a plurality of diode type structures each having at least one metal contact which is flush with the first surface, the structures including doped zones each at a first respective location of the semiconductor layer, each doped zone having a second conductivity type in which holes are the majority carriers, this second conductivity type being provided by means of an arsenic doping, wherein the semiconductor layer further comprises:

an aperture provided in the semiconductor layer from the first surface towards the second surface, and an alignment mark formed at a second location located in the aperture, the alignment mark having the second conductivity type, the second conductivity type being provided by means of an arsenic doping opening into the second surface, and a third cadmium proportion higher than the second cadmium proportion of the second material at a same distance from the second surface, the alignment mark being flush with the second surface of the semiconductor layer, wherein the second surface of the semiconductor layer has a height difference between the alignment mark, which is flush with the second surface and which corresponds to the second location, and the rest of the second surface.

14. The first support according to claim 13, wherein the alignment mark is in the form of a valley relative to the rest of the second surface of the semiconductor layer.

15. The first support according to claim 13, wherein the alignment mark projects from the rest of the second surface of the semiconductor layer.

16. An optoelectronic component comprising:

a first support according to claim 13, and a second support, wherein the first support is assembled through its second face to the second support aligned with said second support.

17. A method of manufacturing a first support for forming, with a second support, an optoelectronic component, the first support having a first and a second face and comprising a semiconductor layer, the semiconductor layer having a first and a second surface and being made of a second material which comprises a second cadmium atomic proportion, wherein the semiconductor layer comprises a plurality of diode type structures each having at least one metal contact which is flush with the first surface, the structures including doped zones each at a first respective location of the semiconductor layer, each doped zone having a second conductivity type in which holes are the majority carriers, the second conductivity type being provided by means of an arsenic doping, and wherein the semiconductor layer further comprises an aperture provided from the first surface towards the second surface, and an alignment mark formed at a second location located in the aperture, the alignment mark having the second conductivity type, the second conductivity type being provided by means of an arsenic doping opening into the second surface, and a third cadmium atomic proportion higher than the second cadmium atomic proportion of the second material at a same distance from the second surface, the alignment mark being flush with the second surface of the semiconductor layer, and wherein the second surface of the semiconductor layer has a height difference between the alignment mark, which is flush with the second surface and which corresponds to the second location, and the rest of the second surface, the method comprising:

providing a substrate comprising the semiconductor layer and a support layer made of a first material comprising cadmium with a first cadmium atomic proportion, the second cadmium atomic proportion being lower than the first cadmium atomic proportion, implanting in a localized manner arsenic into the semiconductor layer through the first surface on a plurality of first locations of the semiconductor layer, each first location corresponding to a structure, and on a second location, corresponding to the alignment mark, the localized implantation reaching the second surface in the second location;

performing a heat treatment to activate the implanted arsenic on the plurality of first locations to form the doped zones of a second conductivity type in which the majority carriers are holes, the heat treatment being also adapted to allow cadmium diffusion from the support layer to the second location, the cadmium diffusion being promoted by the arsenic implanted in said second location;

forming the alignment mark to be flush with the second surface and having the third cadmium atomic proportion higher than the second cadmium atomic proportion of a remainder of the semiconductor layer at a same distance from the second surface; and removing the support layer and a part of the thickness of the semiconductor layer using an etching process sensitive to cadmium atomic proportion to provide the height difference between the alignment mark and the remainder of the second surface, the semiconductor layer thus released from the support layer forming the first support, the first and second surfaces of the semiconductor layer forming the first and second faces of said first support.

* * * * *